(12) United States Patent
Koshelev et al.

(10) Patent No.: US 7,528,395 B2
(45) Date of Patent: *May 5, 2009

(54) RADIATION SOURCE, LITHOGRAPHIC APPARATUS AND DEVICE MANUFACTURING METHOD

(75) Inventors: Konstantin Nikolaevitch Koshelev, Troitsk (RU); Vadim Yevgenyevich Banine, Helmond (NL); Vladimir Vital'Evitch Ivanov, Moscow (RU); Erik René Kieft, Eindhoven (NL); Erik Roelof Loopstra, Heeze (NL); Lucas Henricus Johannes Stevens, Eindhoven (NL); Yurii Victorovitch Sidelkov, Troitsk (RU); Vsevolod Grigorevitch Koloshnikov, Moscow (RU); Vladimir Mihailovitch Krivtsun, Troitsk (RU); Robert Rafilevitch Gayazov, Troitsk (RU); Olav Waldemar Vladimir Frijns, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 69 days.

This patent is subject to a terminal disclaimer.

(21) Appl. No.: 10/664,065

(22) Filed: Sep. 17, 2003

(65) Prior Publication Data

US 2004/0105082 A1   Jun. 3, 2004

(30) Foreign Application Priority Data

Sep. 19, 2002  (EP) ................................. 02256486
Oct. 3, 2002   (EP) ................................. 02256907

(51) Int. Cl.
G03B 27/42   (2006.01)
G21K 5/10    (2006.01)
H01J 37/08   (2006.01)

(52) U.S. Cl. ............. 250/493.1; 250/492.2; 250/504 R; 378/119; 378/34; 378/141; 315/111.21; 372/76
(58) Field of Classification Search ............. 250/492.2, 250/493.1, 504 R; 378/119, 34, 141; 315/111.21; 372/76

See application file for complete search history.

(56) References Cited

U.S. PATENT DOCUMENTS 4,176,297 A   11/1979  Thistle et al.

(Continued)

FOREIGN PATENT DOCUMENTS

GB   1496442 A   12/1977

(Continued)

OTHER PUBLICATIONS

Taiwan Office Action in TW Patent Application No. 092125623, dated Feb. 20, 2006.

(Continued)

*Primary Examiner*—Nikita Wells
(74) *Attorney, Agent, or Firm*—Pillsbury Winthrop Shaw Pittman LLP

(57) ABSTRACT

A radiation source comprises an anode and a cathode that are configured and arranged to create a discharge in a gas or vapor in a space between anode and cathode and to form a plasma pinch so as to generate electromagnetic radiation. The gas or vapor may comprise xenon, indium, lithium and/or tin. The radiation source may comprise a plurality of discharge elements, each of which is only used for short intervals, after which another discharge element is selected. The radiation source may also comprise a triggering device, which device can facilitate improving the exact timing of the pinch formation and thus the pulse of EUV radiation. The radiation source may also be constructed to have a low inductance, and operated in a self-triggering regime.

42 Claims, 14 Drawing Sheets

U.S. PATENT DOCUMENTS

| | | | |
|---|---|---|---|
| 4,596,030 A | 6/1986 | Herziger et al. | 378/119 |
| 4,627,088 A | 12/1986 | Doucet et al. | 378/122 |
| 4,928,296 A | 5/1990 | Kadambi | |
| 5,317,574 A | 5/1994 | Wang | 372/5 |
| 5,499,282 A | 3/1996 | Silfvast | 378/119 |
| 6,414,438 B1 * | 7/2002 | Borisov et al. | 315/111.31 |
| 6,452,194 B2 * | 9/2002 | Bijkerk et al. | 250/492.2 |
| 6,815,700 B2 * | 11/2004 | Melnychuk et al. | 250/504 R |
| 6,933,510 B2 * | 8/2005 | Zukavishvili et al. | 250/492.2 |
| 7,208,746 B2 * | 4/2007 | Koshelev et al. | 250/492.2 |

FOREIGN PATENT DOCUMENTS

| | | |
|---|---|---|
| GB | 2 101 638 A | 1/1983 |
| JP | 4-110800 | 4/1992 |
| JP | 05-190955 | 7/1993 |
| JP | 2000-298200 | 10/2000 |
| JP | 2001-160499 | 6/2001 |
| JP | 2003-503814 | 1/2003 |
| JP | 2003-051398 | 3/2003 |
| WO | WO 2004/023852 A2 | 3/2004 |

OTHER PUBLICATIONS

Klaus Bergmann et al., "Highly Repetitive, Extreme-Ultraviolet Radiation Source Based on a Gas-Discharge Plasma," *Applied Optics*, Sep. 1, 1999, vol. 38, No. 25, pp. 5413-5417.

Australian Patent Office, SG 200305633, Written Opinion, dated Mar. 24, 2005.

Partial European Search Report issued on Nov. 7, 2008 in corresponding European Application No. 03255825.6.

* cited by examiner

RADIATION SOURCE, LITHOGRAPHIC APPARATUS AND DEVICE MANUFACTURING METHOD

This application claims priority from European patent applications EP 02256486.8 filed Sep. 19, 2002 and EP 02256907.3 filed Oct. 3, 2002, both herein incorporated by reference in their entirety.

FIELD

The present invention relates to a radiation source comprising an anode and a cathode that are configured and arranged to create a discharge in a substance in a space between said anode and cathode and to form a plasma so as to generate electromagnetic radiation.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

- a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;
- a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from United States patents U.S. Pat. Nos. 5,296,891 and 5,523,193, which are incorporated herein by reference. In the case of a programmable mirror array, the said support structure may be embodied as a frame or table, for example, which may be fixed or movable as required; and
- a programmable LCD array. An example of such a construction is given in United States patent U.S. Pat. No. 5,229,872, which is incorporated herein by reference. As above, the support structure in this case may be embodied as a frame or table, for example, which maybe fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from United States patent U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in United States patent U.S. Pat. No. 5,969,441 and PCT patent application publication WO 98/40791, incorporated herein by reference.

In a lithographic apparatus, the size of features that can be imaged onto a substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet, also referred to as XUV or EUV, radiation. The abbreviation 'XUV' generally refers to the wavelength range from several tenths of a nanometer to several tens of nanometers, combining the soft x-ray and vacuum UV range, whereas the term 'EUV' is normally used in conjunction with lithography (EUVL) and refers to a radiation band from approximately 5 to 20 nm, i.e. part of the XUV range.

A radiation source for XUV radiation may be a discharge plasma radiation source, in which a plasma is generated by a discharge in a substance (for instance, a gas or vapor) between an anode and a cathode and in which a high temperature discharge plasma may be created by Ohmic heating by a (pulsed) current flowing through the plasma. Further, compression of a plasma due to a magnetic field generated by a current flowing through the plasma may be used to create a high temperature, high density plasma on a discharge axis (pinch effect). Stored electrical energy is directly transferred to the plasma temperature and hence to short-wavelength radiation. A pinch may allow for a plasma having a considerably higher temperature and density on the discharge axis, offering an extremely large conversion efficiency of stored electrical energy into thermal plasma energy and thus into XUV radiation. The geometry of devices, such as plasma focus, Z-pinch, hollow-cathode and capillary discharge sources, may vary, but in each of these types a magnetic field generated by the electrical current of the discharge drives the compression.

FIGS. 5A to 5E are included to provide background information about the construction and operation of such a discharge plasma radiation source. FIGS. 5A to 5E show schematically a discharge plasma radiation source comprising a single discharge element 540 of the Z-pinch hollow-cathode type. The discharge element 540 has cylindrical symmetry and comprises an anode 520 and a cathode 510 connected by an electrically insulating cylindrical wall 525. An aperture 530 is provided in the anode 520 on a central axis B for passing electromagnetic radiation from the discharge element 540. The hollow cathode 510 is provided with an annular aperture 511 around the central axis B, and is further provided with a large cavity 512 behind the aperture 511. The cavity 512 also has an annular configuration around central axis B, and the walls of the cavity are a part of the cathode 510. A discharge power supply (not shown) is connected to the anode 520 and cathode 510 to provide for a pulsed voltage V across the anode-cathode gap inside the discharge element 540. Further, a suitable gas or vapor, is provided by a discharge material supply (not shown) at a certain pressure p between the anode and cathode. Examples of suitable substances are xenon, lithium, tin and indium.

A discharge may take place at low initial pressure (p<0.5 Torr) and high voltage (V<10 kV) conditions, for which the electron mean free path is large compared to the dimension of the anode-cathode gap, so that Townsend ionization is ineffective. Those conditions are characterized by a large electrical field strength over gas or vapor density ratio, E/N. This stage shows rather equally spaced equipotential lines EP having a fixed potential difference, as is depicted in FIG. 5A.

The ionization growth is initially dominated by events inside the hollow cathode 510 that operates at considerable lower E/N, resulting in a smaller mean free path for the electrons. Electrons e from the hollow cathode 510, and derived from the gas or vapor within the cavity 512, are injected into the anode-cathode gap, a virtual anode being created with ongoing ionization, which virtual anode propagates from the anode 520 towards the hollow cathode 510, bringing the full anode potential close to the cathode 510, as is shown in FIG. 5B by unevenly distributed equipotential lines EP. The electric field inside the hollow cavity 512 of the cathode 510 is now significantly enhanced.

In the next phase, the ionization continues, leading to a rapid development of a high density plasma region inside the hollow cathode 510, immediately behind the cathode aperture 511. Finally, injection of an intense beam of electrons e from this region into the anode-cathode gap, also shown in FIG. 5B, forms the final breakdown channel. The configuration provides for a uniform pre-ionization and breakdown in the discharge volume.

FIG. 5C shows that a discharge has been initiated and a low temperature plasma 535 of the gas or vapor has been created in the anode-cathode gap. An electrical current will be flowing within the plasma from cathode 510 to anode 520, which current will induce an azimuthal magnetic field, having magnetic field strength H, within the discharge element 540. The azimuthal magnetic field causes the plasma 535 to detach from the cylindrical wall 525 and to compress, as is schematically depicted in FIG. 5C.

Dynamic compression of the plasma will take place, as further depicted in FIG. 5D, because the pressure of the azimuthal magnetic field is much larger than the thermal plasma pressure: $H^2/8\pi >> nkT$, in which n represents plasma particle density, k the Boltzmann constant and T the absolute temperature of the plasma. Electrical energy stored in a capacitor bank (part of the discharge power supply, which is not shown) connected to the anode 520 and cathode 510 will most efficiently be converted into energy of the kinetic implosion during the full time of the plasma compression. A homogeneously filled constriction (plasma pinch) 550 with a high spatial stability is created.

At the final stage of plasma compression, i.e. plasma stagnation on the central, or discharge, axis B, the kinetic energy of the plasma is fully converted into thermal energy of the plasma and finally into electromagnetic radiation 560 having a very large contribution in the XUV and EUV ranges (as depicted in FIG. 5E).

It is generally acknowledged that a number of improvements are required before EUV production by gas discharge plasma can be considered suitable (production-worthy) for large scale production of devices, for instance integrated circuits. These include:

higher conversion efficiency. Current sources typically display a conversion efficiency (ratio of power-out at required wavelength to power-in) of approximately 0.5%, resulting in the majority of the input power being converted into heat;

efficient heat removal (cooling). Two components may be distinguished—peak heat load from plasma jets during discharge and average heat load due to repeated discharge. The area over which the heat can be spread is typically limited, and heat removal becomes critical as power levels and repetition rates are increased to achieve a production-worthy source. Overheating of one or more electrode surfaces may occur, affecting pinch size and position if the geometry of the electrodes changes (deformation); and stable pulse timing and energy. For use with a projection lithography device, the source should produce a stable output during projection. This can be negatively influenced by, for instance, variations in EUV pulse timing (jitter), variations in pinch position and size, and variations in EUV pulse energy.

Thus, it would be advantageous to provide a radiation source that provides production-worthy power levels and repetition rates without risk of overheating. Further, it would be advantageous to provide a radiation source having well-defined timing and well-defined energy of generated pulses (shots) of XUV radiation. It would also be advantageous to provide a radiation source that provides an enhanced conversion efficiency of electrical energy into radiation.

SUMMARY

In one aspect, there is provided a radiation source comprising an anode and a cathode that are configured and arranged to create a discharge within a discharge element in a substance in a space between said anode and said cathode to form a plasma so as to generate electromagnetic radiation, wherein said radiation source comprises a plurality of discharge elements. The substance, for instance, a gas or vapor, may comprise xenon, indium, lithium, tin or any other suitable material. To improve heat dissipation, each discharge element may be only used for short intervals, after which one of the other discharge elements is selected.

In another aspect, there is provided a radiation source comprising an anode and a cathode that are configured and arranged to create a discharge in a substance in a discharge space between said anode and said cathode to form a plasma so as to generate electromagnetic radiation, wherein said radiation source comprises a triggering device for initiating said discharge by irradiating a surface proximate said discharge space with an energetic beam. This precipitates plasma pinch formation by one or more suitable mechanisms such as disturbing the electrical field inside the cavity, changing the conductivity of a material between the electrodes, supplying material by ablation and/or creating photoionization. Irradiating a surface, for instance, on the cathode improves the timing of the plasma pinch formation and thus the timing of the XUV pulse.

In yet another aspect, there is provided a radiation source constructed to have a low inductance, and comprising an anode and a cathode that are configured and arranged to create a discharge in a substance in a discharge space between said anode and said cathode to form a plasma so as to generate electromagnetic radiation, wherein said method comprises generally an initial discharge followed by operating said radiation source so as to allow successive discharges to occur due to a substantially self-regulated oscillation within said discharge source. The small dimensions and the superimposition of multiple plasma pinches onto a permanent discharge allow the inductive energy to be divided over multiple plasma pinches, improving the conversion efficiency.

According to a further aspect, there is provided a lithographic projection apparatus comprising:

a radiation system for providing a projection beam of radiation;

a support structure for supporting patterning device, the patterning device serving to pattern the projection beam according to a desired pattern;

a substrate table for holding a substrate; and a projection system for projecting the patterned beam onto a target portion of the substrate, wherein said radiation system comprises a radiation source as described above.

According to a further aspect, there is provided a device manufacturing method comprising the steps of:

providing a substrate that is at least partially covered by a layer of radiation-sensitive material;

providing a projection beam of radiation using a radiation system as described above;

using patterning device to endow the projection beam with a pattern in its cross-section;

projecting the patterned beam of radiation onto a target portion of the layer of radiation-sensitive material.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm).

BRIEF DESCRIPTION OF THE DRAWINGS

Embodiments of the invention will now be described, by way of example only, with reference to the accompanying schematic drawings, in which corresponding reference symbols indicate corresponding parts, and in which.

The skilled artisan will appreciate that the elements in the figures are illustrated for simplicity and clarity and have not necessarily been drawn to scale. For instance, the dimensions of some of the elements in the figures may be exaggerated relative to other elements to help improve the understanding of the embodiments of the present invention.

DETAILED DESCRIPTION

Figure 1:
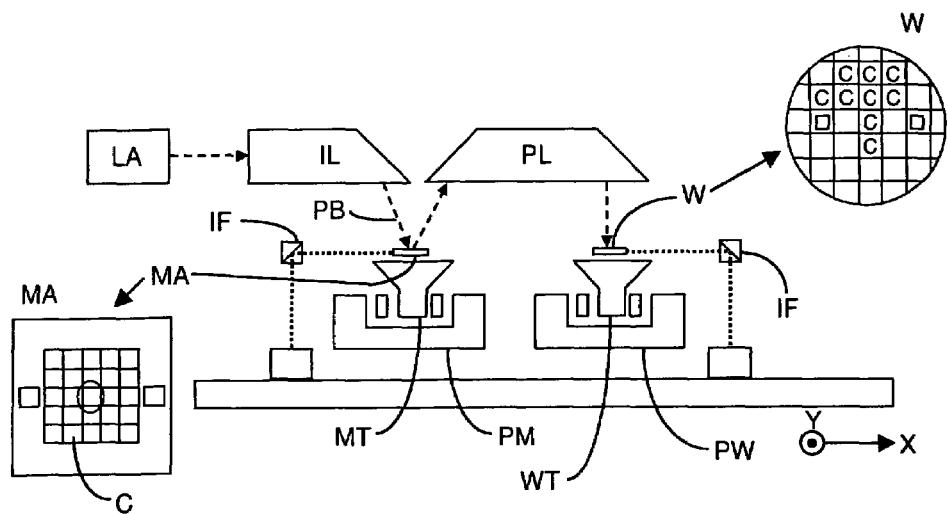
FIG. 1 depicts a lithographic projection apparatus comprising a radiation source according to an embodiment of the invention.

FIG. 1 schematically depicts a lithographic projection apparatus according to a particular embodiment of the invention. The apparatus comprises:

a radiation system LA, IL, for supplying a projection beam PB of radiation, for instance, EUV having a wavelength in the range 5-20 nm. In this particular case, the radiation system also comprises a radiation source LA;

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (e.g. a resist-coated silicon wafer), and connected to second positioning means PW for accurately positioning the substrate with respect to item PL;

a projection system ("lens") PL for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

Referring to FIG. 1, the laser-produced or discharge plasma radiation source LA typically produces a beam of radiation as a train of pulses that are synchronized with the operation of the lithographic projection apparatus. This beam is fed into an illumination system (illuminator) IL, either directly or after having traversed conditioning means, for instance a spectral filter. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus, but that it may also be remote from the lithographic projection apparatus, the radiation beam which it produces being led into the apparatus with the aid of suitable optical components, for instance, directing mirrors. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2A:
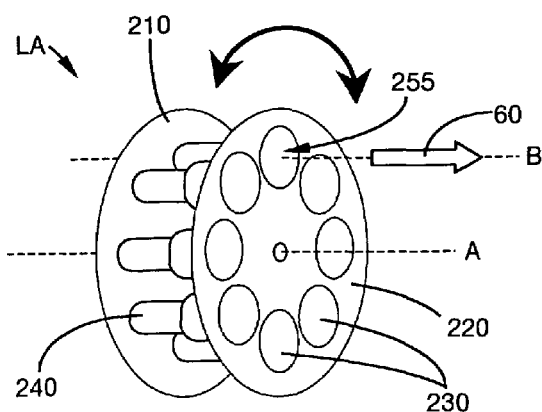
FIGS. 2A, 2B and 2C depict a radiation source comprising a plurality of discharge elements according to an embodiment of the invention.

FIG. 2A shows a radiation source LA according to an embodiment of the invention. The radiation source LA comprises a plurality of plasma discharge elements 240, an anode plate 220, and a cathode plate 210. The anode plate 220 and the cathode plate 210 are electrically isolated from each other. The discharge elements 240 are disposed, substantially symmetrical about an axis of rotation A, between the anode plate 220 and the cathode plate 210 such that the cathode of each discharge element 240 is electrically connected to the cathode plate 210, and such that the anode of each discharge element 240 is electrically connected to the anode plate 220. The source LA is mounted to a suitable support frame (not shown) so that it can rotate about axis A in a predetermined direction. Radiation 60 is emitted along an axis B through a corresponding emission aperture 230 in the anode plate 220 when one of the discharge elements 240 is in a predetermined firing position 255. Alternatively, the radiation source LA may be constructed such that radiation is emitted through an emission aperture in the cathode plate 210. Each discharge element 240 may be rotated into the firing position 255—said firing position 255 is substantially fixed with respect to the lithographic projection apparatus. A discharge power supply (not shown) is connected to the anode plate 220 and cathode plate 210 to provide for a pulsed voltage V across the anode-cathode gap inside each discharge element 240. Further, a suitable substance in the form of a gas or vapor, is provided by a discharge material supply (not shown) at a certain concentration between anode and cathode. Examples of suitable substances are xenon, lithium, tin and indium.

Figure 2B:
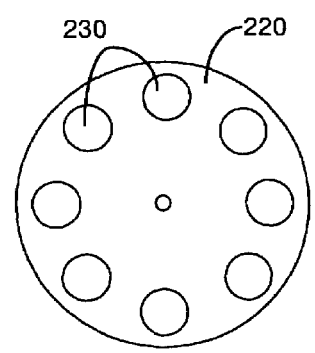

FIG. 2B shows the anode plate 220 in plan view as viewed by the lithographic projection apparatus. Although circular emission apertures 230 are depicted, any geometry can be used, for instance polygon. Similarly, although the anode plate 220 and the cathode plate 210 are depicted as uniform circular discs, any shape or construction may be employed that permits the discharge elements 240 to be repeatedly disposed in the firing position 255. For instance, the shape may be modified to improve cooling, to reduce mass, and/or improve ease of construction. Alternatively, a material may be used without emission apertures 230 if the material is transparent to the emitted radiation 60.

Operation of the radiation source LA is similar to the operation of a Gatling gun. The discharge element 240 at the firing position 255 is operated to produce a plasma pinch, which in turn produces a pulse of radiation 60. After emission of the radiation pulse, the source LA is rotated such that a different discharge element 240 is positioned in the firing position 255. The discharge element 240 at the firing position 255 is operated, and the cycle repeats. Each discharge element 240 is only used once per revolution, giving it time to recover. Typically, recovery will comprise cooling and restoring of the discharge conditions.

Alternatively, each discharge element 240 may be operated in the firing position 255 for a plurality of plasma pinches before rotation. The number of plasma pinches is related to factors including the heat load, and the time needed to restore the discharge conditions in a discharge element 240.

Additionally, it may be advantageous to operate the discharge elements 240 non-sequentially such that each discharge element 240 is not operated each time it is rotated into the firing position 255. In other words, discharge elements 240 may be skipped—for example when an odd number of discharge elements 240 is used and the radiation source turns through two pitches between discharge operation, each discharge element will only be operated once every two revolutions.

Although a radiation source LA with eight discharge elements 240 is depicted, the skilled artisan will appreciate that any number of discharge elements 240 can be used. For instance, if each discharge element 240 is fired once and a pulse frequency of 5 kHz is required, approximately one thousand discharge elements may be used with a rotational speed of approximately 5 revolutions per second.

Additionally, it may be advantageous to identify the discharge element 240 currently in the firing position 255 for control and/or diagnostic purposes. The addition of a measurement device would enable the discharge elements 240 to be rotated into the firing position 255 in any order, and/or to avoid one or more discharge elements 240 that may be performing inadequately.

Figure 2C:
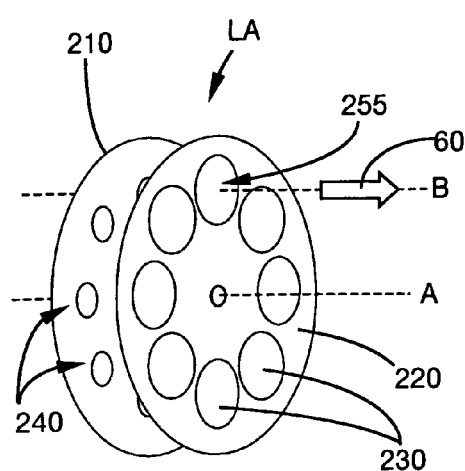

The construction of the radiation source LA can be simplified as depicted in FIG. 2C. Here the discharge elements 240 are not separately discernable structures but corresponding positions in a suitably formed anode plate 220 and cathode plate 210. The discharge element 240 at the firing position 255 is then a fixed combination of an anode plate 220 position and a cathode plate 210 position. The discharge in the firing position may be triggered by any convenient means, such as laser triggering which is described hereafter in more detail. The radiation source LA can be further modified such that only part of the source rotates, or that different parts rotate at different speeds. For example, when the anode is the component that overheats, rotating the anode plate 220 only or rotating the anode plate 220 faster than the cathode plate 210 may be advantageous. In such a case, the discharge element 240 at the firing position 255 is then a particular combination of an anode plate 220 position and a cathode plate 210 position.

Figure 3:
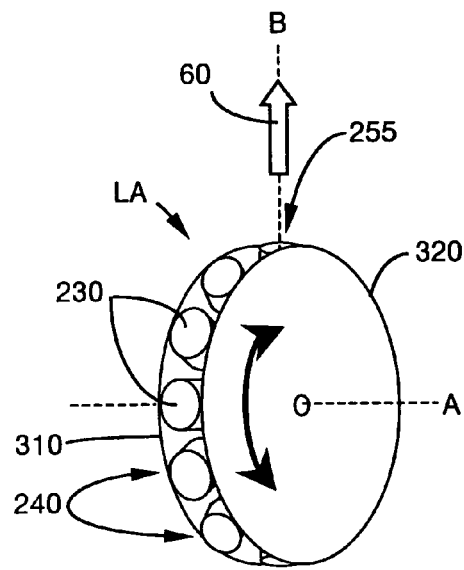
FIG. 3 depicts another embodiment of a radiation source according to the invention.

The embodiments described rotate in a plane perpendicular to the axis of emission B. Alternatively, as shown in FIG. 3, the construction of the source LA may be modified so that the discharge elements 240 rotate about axis A in substantially the same plane as the axis of emission B. The discharge elements 240 are disposed in a substantially symmetrical arrangement between a modified anode plate 320 and a modified cathode plate 310, such that the cathode of each discharge element 240 is electrically connected to the modified cathode plate 310, and the anode of each discharge element 240 is connected electrically to the modified anode plate 320.

The embodiments shown describe the use of discharge elements 240 that are fixed in place, and that are used a multitude of times in their lifetime in the firing position 255. It may be advantageous to modify the radiation source LA such that it employs a continuous supply and removal of single use discharge elements 240, wherein each discharge element 240 is used for one or more times in the firing position 255 before being replaced.

In another alternative, substantially different discharge elements 240 maybe used in one radiation source LA, each discharge element 240 providing a substantially different radiation beam 60 in terms of, for instance, wavelength, cross-section shape, solid angle of emission, size, and/or intensity. Providing these kinds of variations at the source may reduce the complexity of the illumination system and projection lens in the lithographic projection apparatus, especially when dealing with reflective optics.

Additionally, two alternatives may be employed to reduce recovery time:

additional cooling of the discharge elements 240, for instance, by forcing air at a predetermined temperature over the surfaces, and/or constructing the radiation source LA with cooling channels carrying a suitable fluid, for instance liquid metals or water; and increasing the electrical current and/or the supply rate of discharge material by separating the discharge elements 240 into a plurality of groups, each group of one or more discharge elements 240 having its own discharge power supply and/or a separate discharge material supply.

The embodiments of the radiation source LA may be modified to employ discharge elements 240 of any suitable type, such as Z-pinch, capillary discharge, plasma focus, hollow-cathode or laser produced plasma devices. It may be particularly advantageous to employ a discharge element 240 featuring one or more aspects described in European Application No. 02256907.3, incorporated herein by reference in its entirety. These aspects provide increased pulse timing stability, reduced electrode erosion and increased conversion efficiency.

Additionally, some discharge elements 240, such as described in European Application No. 02256907.3, transport a liquid such as xenon, indium, iridium, tin, lithium to an area proximate the discharge space for either fuelling the discharge and/or protecting an electrode during discharge.

Figure 16:
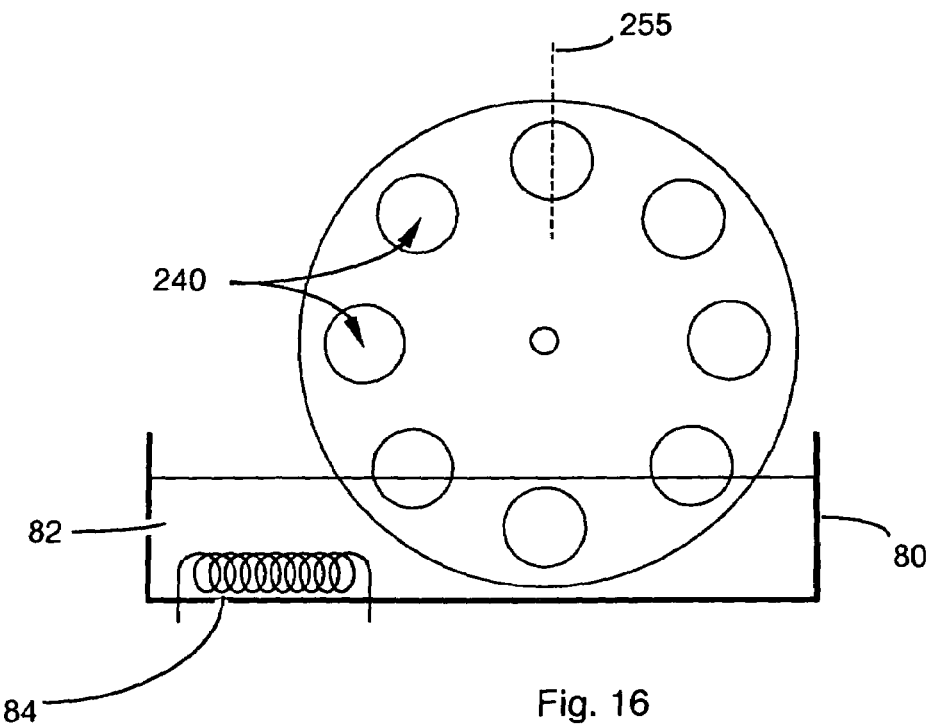
FIG. 16 depicts a radiation source comprising a plurality of discharge elements passing through a liquid according to an embodiment of the invention.

The arrangement shown in FIG. 16 may be used to reduce the recovery time of the source LA employing a plurality of discharge elements 240, by supplementing the existing liquid transport mechanism or even replacing it. The rotating source LA is disposed such that at least one of the discharge elements 240 that is not in the firing position 255 is submerged in a bath 80 of the liquid 82 to be transported to an area proximate the discharge space of that discharge element 240. If required, the bath 80 may also contain a heating element 84 (or cooling element) to keep the liquid at the correct temperature. As the source LA rotates, each discharge element 240 will be operated in the firing position 255 for zero, one or more pulses and then partially or wholly submerged in the bath 80 long enough for the liquid 82 in the area proximate to the discharge space to be replenished.

Figure 4A:
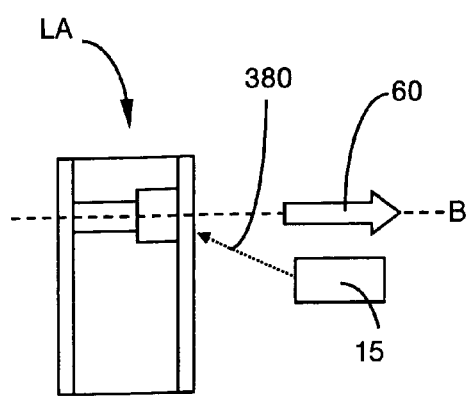
FIGS. 4A to 4B depict a radiation source comprising a laser triggering unit according to an embodiment of the invention.
Figure 4B:
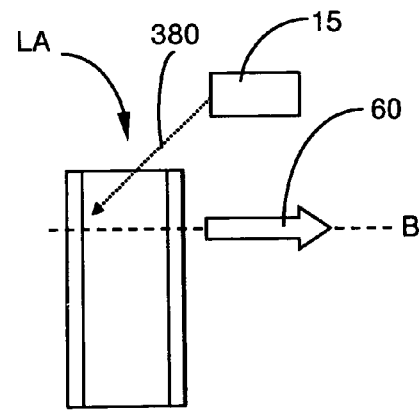
Figure 5A:
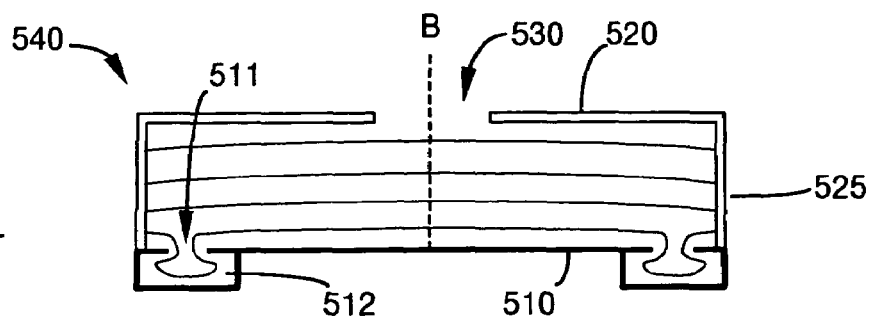
FIGS. 5A to 5E depict a discharge of the hollow-cathode type at various stages of discharge.
Figure 5B:
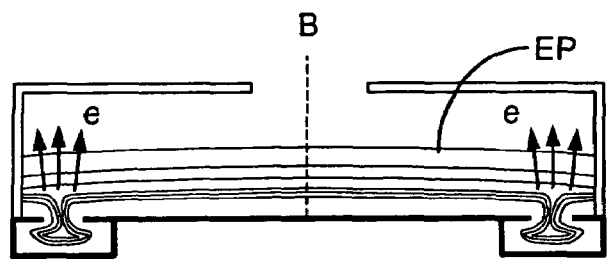
Figure 5C:
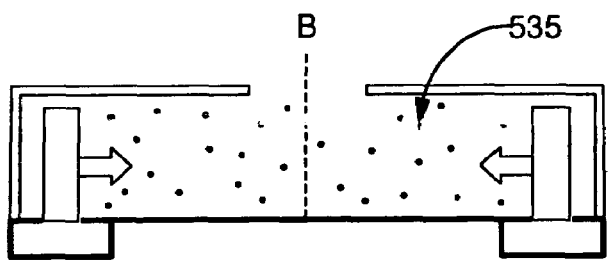
Figure 5D:
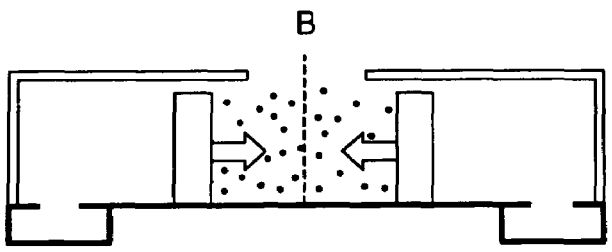
Figure 5E:
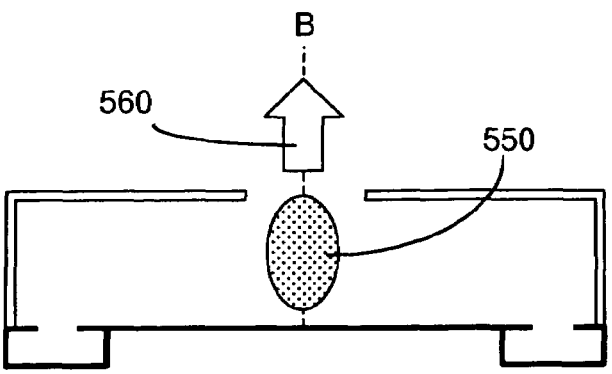

A further aspect of the radiation source LA is depicted in FIG. 4A. A laser triggering unit 15 is disposed such that it can fire a beam of laser light 380 at a predetermined target in a radiation source LA, without impeding the path of emitted radiation 60 along axis B to the lithographic projection apparatus. As shown in FIG. 4B, it may be advantageous to direct the laser beam 380 into the radiation source LA along a path further away from the path of the emitted radiation 60. This would be possible, for example, with the source LA depicted in FIG. 2C.

FIGS. 6A to 6E are used to explain the general principle of pinch triggering using a beam of laser light 380. These figures show a cross-section through a discharge element 240, comprising an anode 20 and a cathode 10 that are electrically isolated. The assembly is substantially sealed, and supplied with a gas or vapor at low pressure, for instance xenon or lithium, from a discharge material supply (not shown). The anode 20 and cathode 10 are connected to a discharge power supply (not shown). Discharge field lines 45 are also shown. Pinch formation is triggered using a suitable beam of laser light 380, for instance wavelength: 254-1060 nm, power: 10-100 mJ in 1-20 ns, diameter: 0.3-1 mm.

Figure 6A:
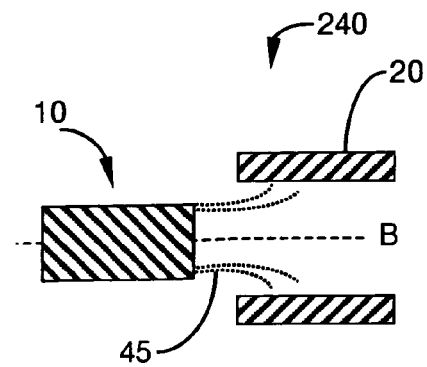
FIGS. 6A to 6E depict a discharge element according to an embodiment of the invention at various stages of another type of discharge according to an embodiment of the invention.
Figure 6B:
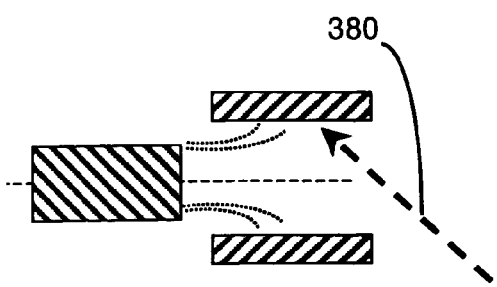
Figure 6C:
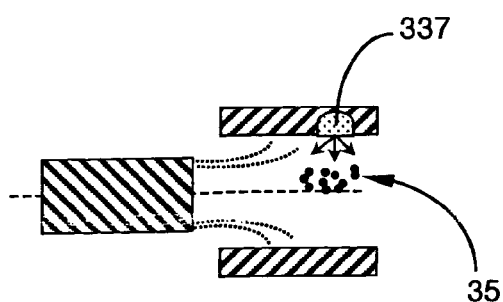

As depicted in FIG. 6A, the discharge element 240 is brought into a state where a pinch is about to form, using the discharge power supply (not shown) and the discharge material supply (not shown). For instance, the anode 20 is connected to ground, the cathode 10 is connected to an a.c. voltage of 11 kV at 100 Hz, and xenon is supplied at a rate of 4 sccm (standard cubic centimeters per minute). At a predetermined moment in the cycling of the discharge power supply (not shown), the beam of laser light 380 is fired at a predetermined point on the surface of the anode (see FIG. 6B). The beam of laser light 380 causes a region 337 to be heated, and some of the material 35 will be evaporated from the surface (ablation) as shown in FIG. 6C. The material ejected 35 enters the discharge region, and triggers the pinch effect (see FIG. 6D) that results in a constriction (pinch) 50 containing hot plasma (see FIG. 6E). This plasma has a high resistance due to its small cross-section, and effectively transforms the electrical energy of the discharge into thermal energy of the plasma, and finally into emitted radiation 60 along axis B. After the pinch, the device will return to a state of diffused discharge (see FIG. 6A).

Triggering in this way eliminates uncertainties in the timing and spatial position of the discharge caused by, for instance, electrode erosion, electrode deformation, variations in the supply rate of discharge material and/or variations in the power supply.

Figure 6D:
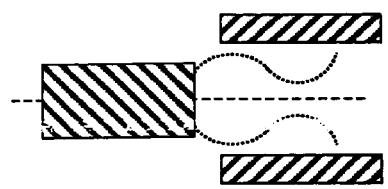
Figure 6E:
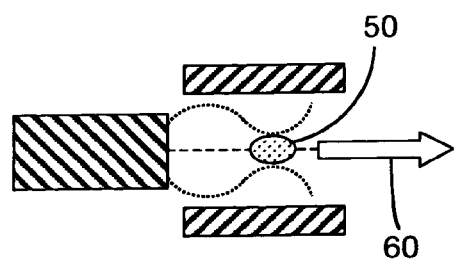
Figure 9A:
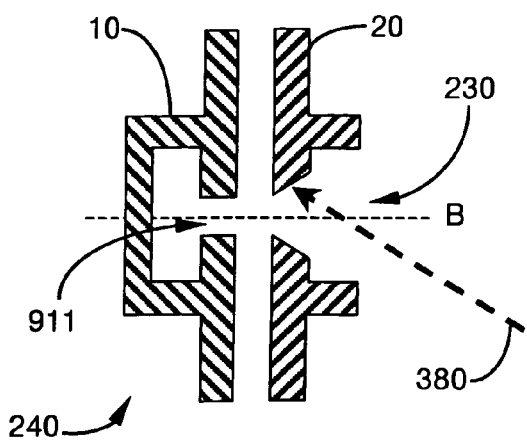
FIGS. 9A to 9E depict different ramifications for discharge triggering according to an embodiment of the invention.

FIG. 9A depicts a cross-section through a further embodiment, a discharge element 240 of the hollow-cathode type, comprising an anode 20 and a hollow cathode 10 that are electrically isolated. An aperture 911 is provided in the cathode 10, and an emission aperture 230 is provided in the anode 20. The anode may be composed of any suitable material, for instance tungsten. The assembly is substantially sealed, and supplied with a gas or vapor at low pressure, for instance xenon or lithium, from a discharge material supply (not shown). The anode 20 and cathode 10 are connected to a discharge power supply (not shown). The discharge element 240 is brought into a state where a pinch is about to form, using the discharge power supply (not shown) and the discharge material supply (not shown). At a predetermined moment in the cycling of the discharge power supply (not shown), a beam of laser light 380 is fired at a region close to the emission aperture 230 on the anode 20. Pinch formation and subsequent radiation emission occur in a similar way as depicted in FIGS. 6C to 6E.

Figure 9B:
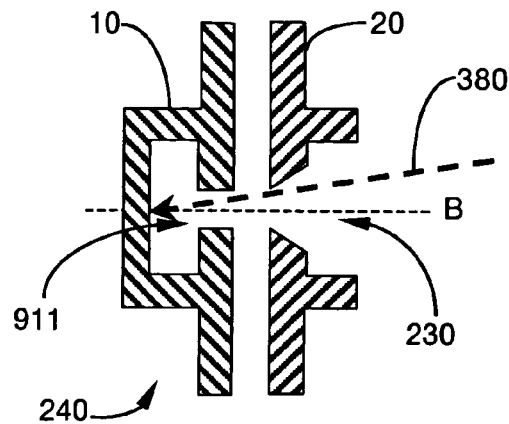
Figure 9C:
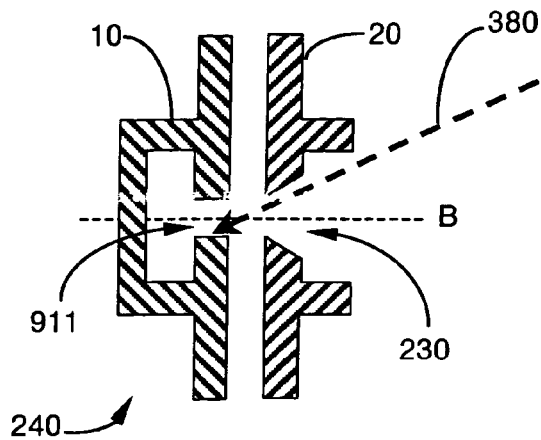
Figure 9D:
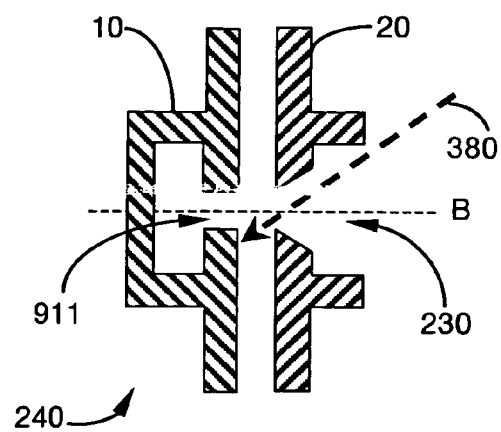
Figure 9E:
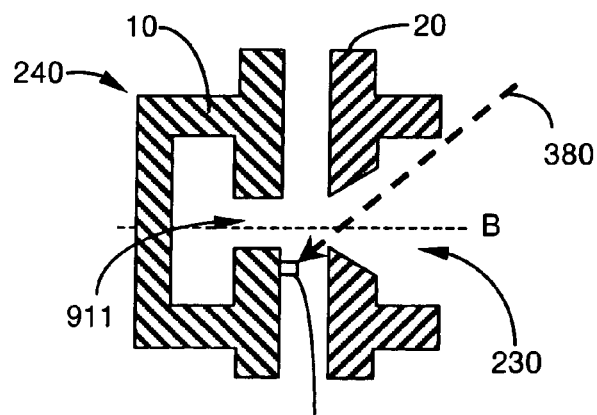

The expected method of triggering the pinch is to fire the beam of laser light 380 at a predetermined target on the cathode 10 as depicted in FIGS. 9B to 9E:

the rear wall of the hollow cathode 10 (as depicted in FIG. 9B);

the cathode aperture 911 (as depicted in FIG. 9C);

a point on the cathode 10 close to the cathode aperture 911 between the cathode 10 and the anode 20 (as depicted in FIG. 9D); and a protruding structure (trigger pin) 355 on a surface adjacent to the discharge area between the cathode 10 and the anode 20 (as shown in FIG. 9E). The trigger pin 355 may be comprised of the same material as the cathode, and/or the solid form of the gas or vapor used to form the plasma, and/or a different material chosen for its evaporation properties. For instance, xenon, tin, lithium, indium and iridium may be used.

However, the embodiment (as shown in FIG. 9A) where the beam of laser light 380 irradiates a part of the anode 20 provides the following advantages:

the position of the pinch and thus the emitted radiation is stable relative to the central axis B, resulting in a stable radiation pulse energy and timing; and the pinch position is close to the central axis B, so the production of debris caused by electrode erosion is low.

It may be advantageous to employ a protruding structure (trigger pin) 355 similar to the one shown in FIG. 9E, but on a surface of the anode 20 adjacent to the emission aperture 230. A further alternative is to configure the position and energy of the laser beam 380 such that some or all the discharge material may be provided by ablating material from a suitable surface in the source LA. It may also be advantageous to employ another radiation or particle source instead of a laser beam 380, for instance an electron-beam.

Figure 17A:
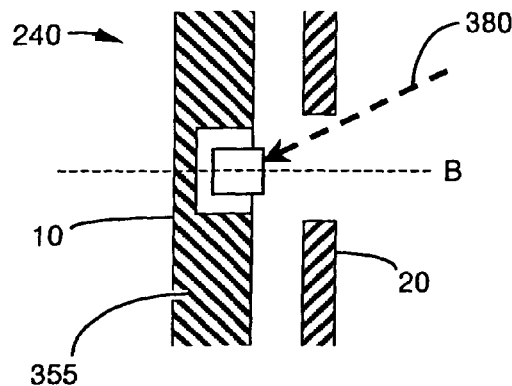
FIGS. 17A to 17E depict different ramifications for discharge triggering according to an embodiment of the invention.

When triggering the discharge using a laser impinging on a first electrode, for example the cathode, the plasma near the other (second) electrode, for example the anode, has a low density and may have a high anomalous resistance. Experiments have shown that approximately 25% of the energy from the discharge power supply is used to overcome this resistance before the discharge can start, and this can reduce the efficiency of the discharge element. A possible solution for this is to employ an external switch to delay the current from the discharge power supply until the material ablated from the first electrode has been allowed to increase the plasma density in the region of the second electrode. Unfortunately, the use of an external switch increases the inductance of the external circuit which typically reduces the efficiency of the source. A particularly advantageous alternative is shown in FIG. 17A. This figure shows a cross-section through the central part of a discharge element 240, in which the cathode 10 comprises a protruding trigger pin 355 which is electrically isolated from the cathode 10. When the laser beam 380 impinges upon the triggering pin 355, material is ablated and allowed to spread towards the discharge space. The discharge can only start when the material reaches both the anode and the cathode, so the time delay created can be influenced by changing the size of the trigger pin 355, the distance between the trigger pin 355 and the discharge space, and the distance between the surface of the trigger pin 355 where the laser beam 380 impinges and the electrodes (anode and cathode). This means that the time delay can be selected without influencing the geometry, and thus the inductivity, of the source. Typically for a discharge element 240 with a gap of 3.5 mm to 6.5 mm between the cathode 10 and the anode 20, the gap between the trigger pin 355 and the cathode 20 is between 0.3 to 0.6 mm; the protrusion of the trigger pin above the surface of the cathode is 0.5 to 1.5 mm and the diameter of the trigger pin is about 1 to 4 mm.

Figure 17B:
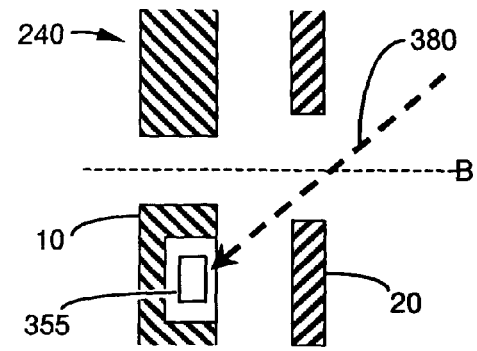
Figure 17C:
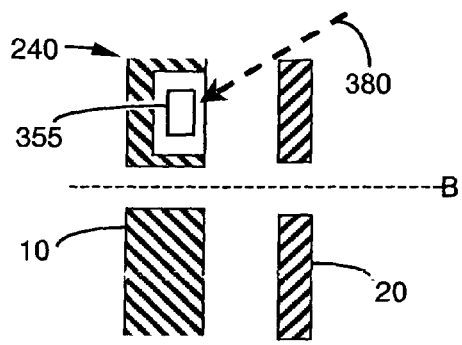
Figure 17D:
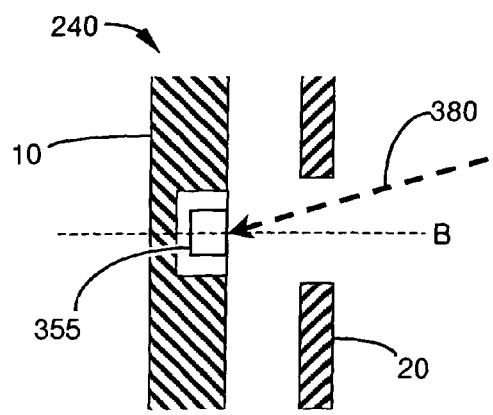
Figure 17E:
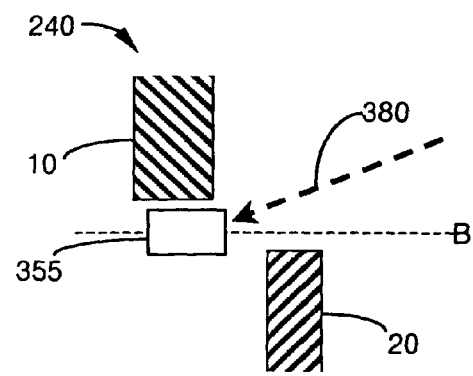

Many variations on this are possible, depending on the delay required and the configurations of the cathode 10 and anode 10. These variations include recessing the surface of the trigger pin 355 as shown in FIG. 17B; directing the laser beam along a path other than through the anode 20 aperture as shown in FIG. 17C; keeping the trigger pin 355 level with the cathode 10 surface as shown in FIG. 17D and disposing the trigger pin 355 in the center of the discharge element 240 when using a non-symmetrical cathode 10/anode 20 configuration as depicted in FIG. 17E.

In a similar way to the embodiments described previously, the isolated trigger pin 355 may comprise part of the anode instead of the cathode, or the trigger pin 355 may be a separate structure within the source LA that forms no part of the electrodes. A plurality of known and new triggering methods maybe combined for a further improvement in the characteristics of the radiation source LA.

Figure 10:
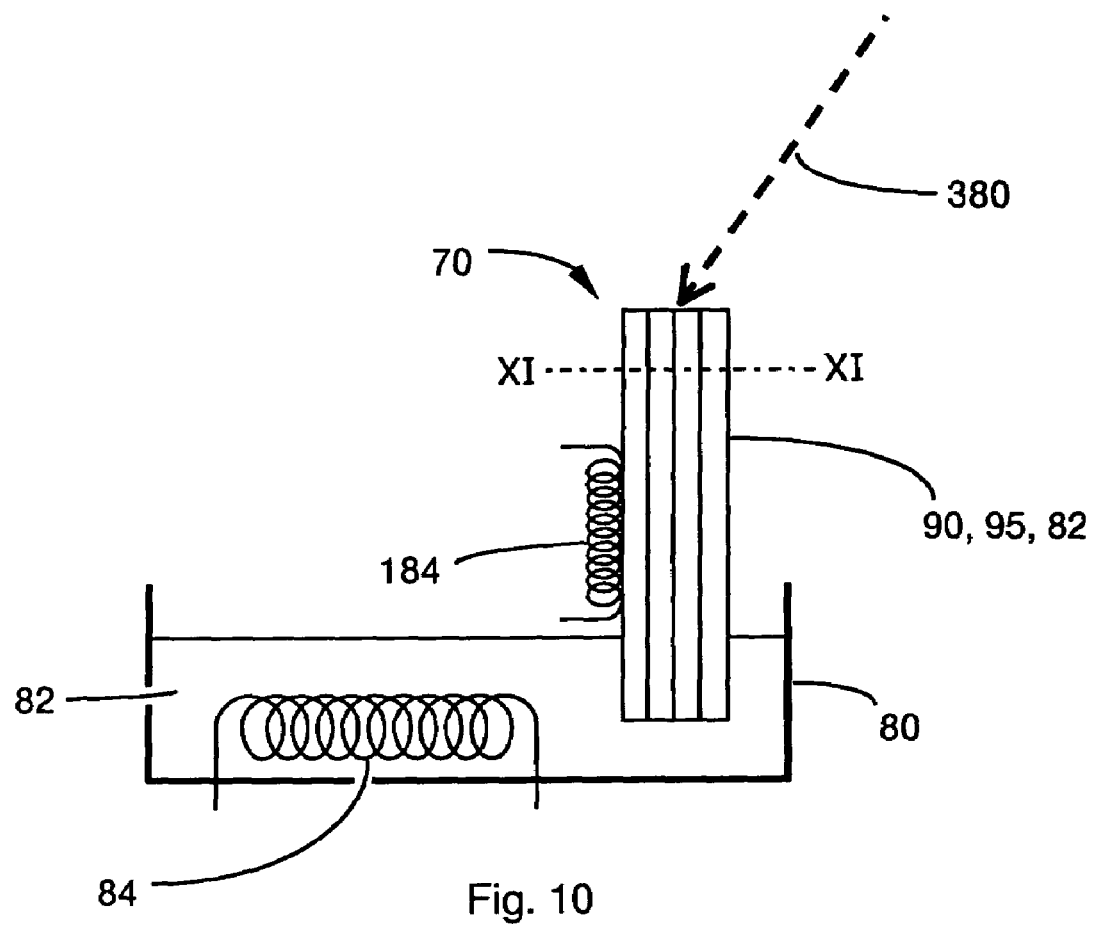
FIG. 10 depicts a target structure for discharge triggering comprising a wicking structure according to an embodiment of the invention.
Figure 11A:
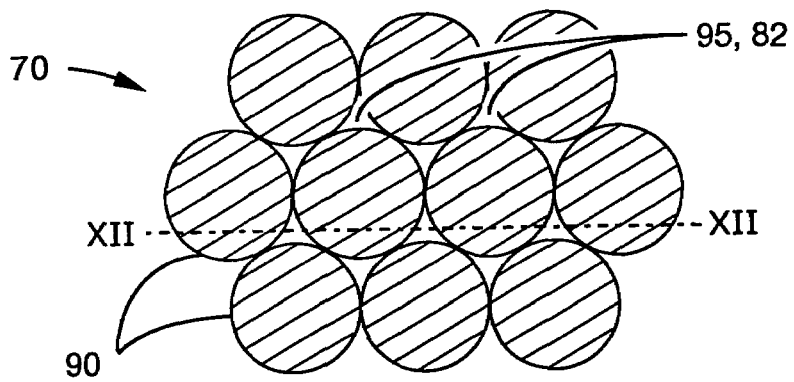
FIGS. 11A to 11C depict possible cross-sections through a wicking structure according to an embodiment of the invention.
Figure 12A:
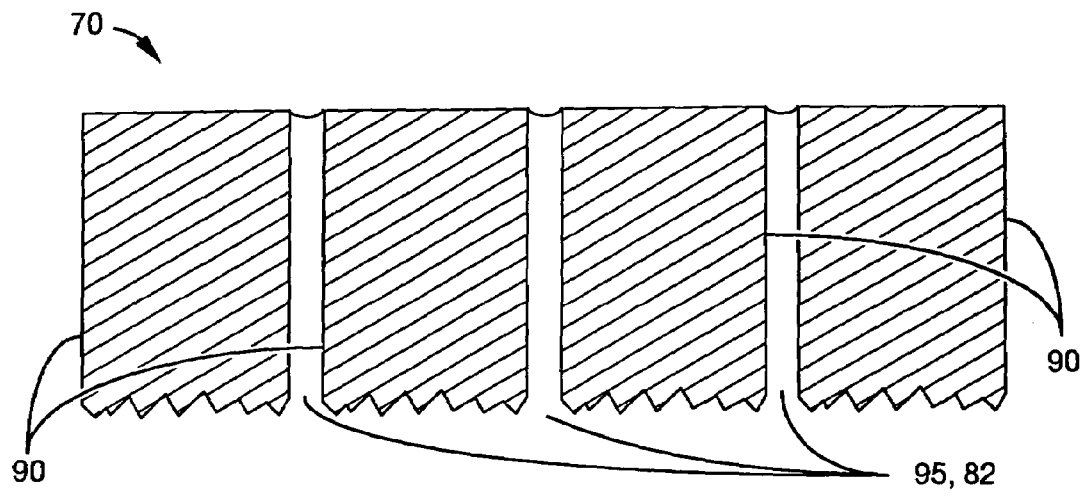
FIGS. 12A to 12C depict cross-sections through a wicking structure at various stages of discharge triggering according to an embodiment of the invention.
Figure 12B:
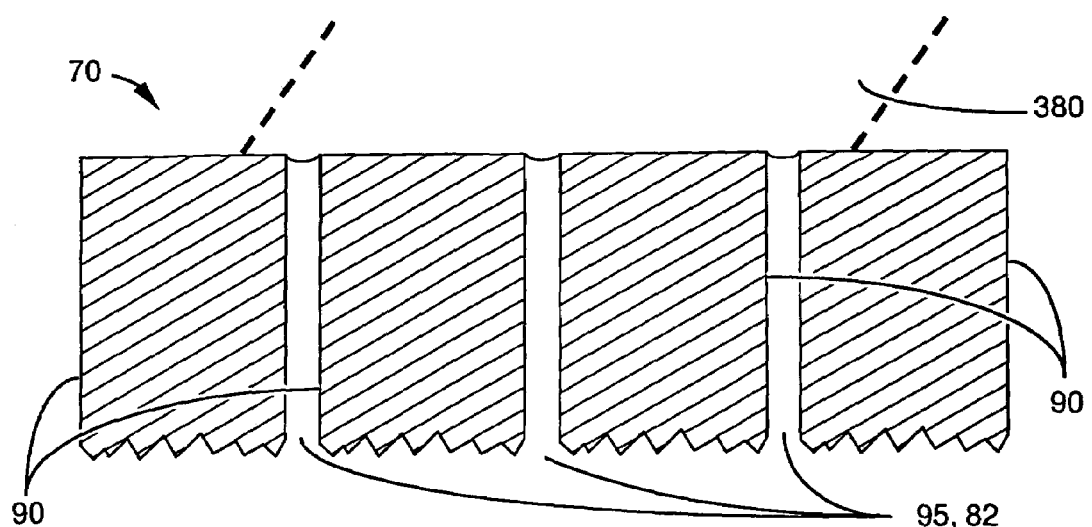
Figure 12C:
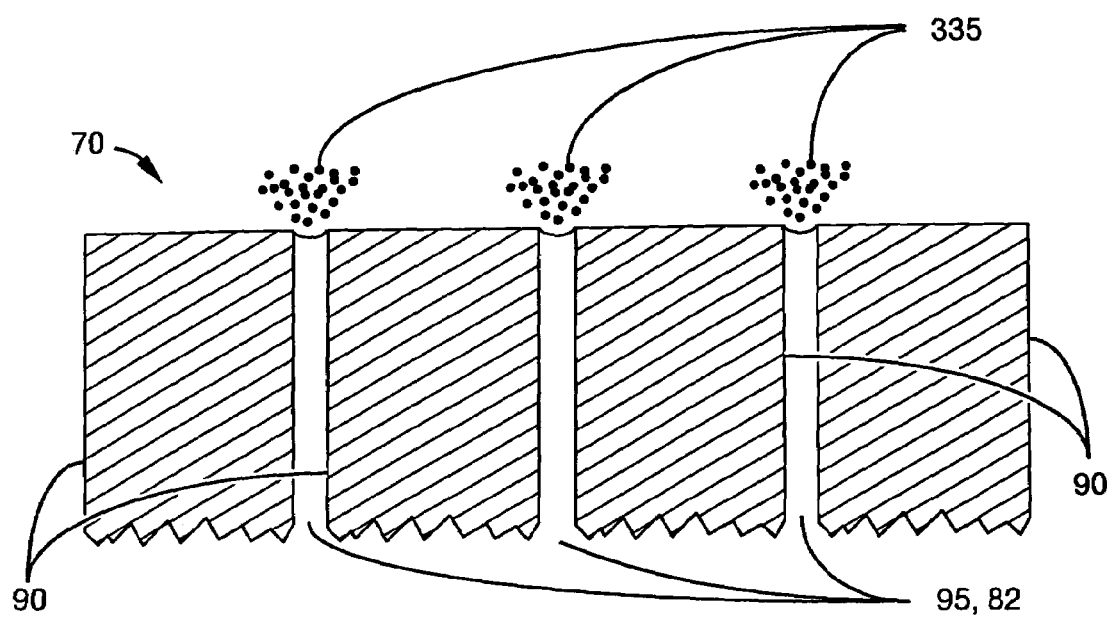

It may also be advantageous to employ a trigger structure 355 which further comprises a suitable liquid surface. Within a discharge source, a convenient method of transporting liquids is to use a wicking structure such as that described in European Application No. 02256907.3. FIG. 10 depicts an improved wicking structure 70, with a first end immersed in a bath 80 of liquid 82 and a second end disposed proximate the discharge area which can be irradiated by a radiation or particle beam 380. The liquid 82 may be the liquid form of the material used to make the cathode and/or anode, and/or the liquid form of the gas or vapor used to form the plasma, and/or a different liquid chosen for its evaporation properties. Examples of suitable substances are xenon, tin, lithium, indium and iridium. In some cases, the liquid 82 may need to be heated using heater elements 84 and 184 in the bath and wicking structure to ensure a steady flow through the wicking structure 70. FIG. 11A depicts a section taken along line XI-XI of FIG. 10 through the wicking structure 70, which comprises substantially cylindrical structures 90, for example wires, placed in contact with each other. The gaps 95 between the structures 90 define substantially regular channels containing the liquid 82, such that the shape and size of the gaps 95 is influenced by the size and arrangement of the structures 90. FIG. 12A depicts a section along the line XII-XII of FIG. 11A through the second end of the wicking structure 70, showing the cylindrical structures 90 and the gaps 95 containing the liquid 82. The liquid 82 is kept at an optimal temperature using either the heating elements 84 and 184, the heat of discharge or a combination of these. Under influence of the capillary effect, the liquid 82 will flow from the bath 80 through the narrow channels 95 from the first end to the second end of the wicking structure 70. As shown in FIG. 12A, the liquid 82 will be evenly distributed throughout the wicking structure 70 due to the regular arrangement of the cylindrical structures 90. In addition, the flow rate through each channel 95 will be substantially the same due to the substantially equal volume and shape of the channels 95. As shown in FIGS. 12B and 12C, the beam 380 causes a region of the second end of the wicking structure 70 to be heated. This region comprises a plurality of channels 95, within which the liquid 82 will be heated, creating a vapor 335 above the surface. The vapor 335 enters the discharge region, and triggers a pinch effect. The liquid evaporated 335 will be replenished from the bath 80 under influence of the capillary effect.

Figure 11B:
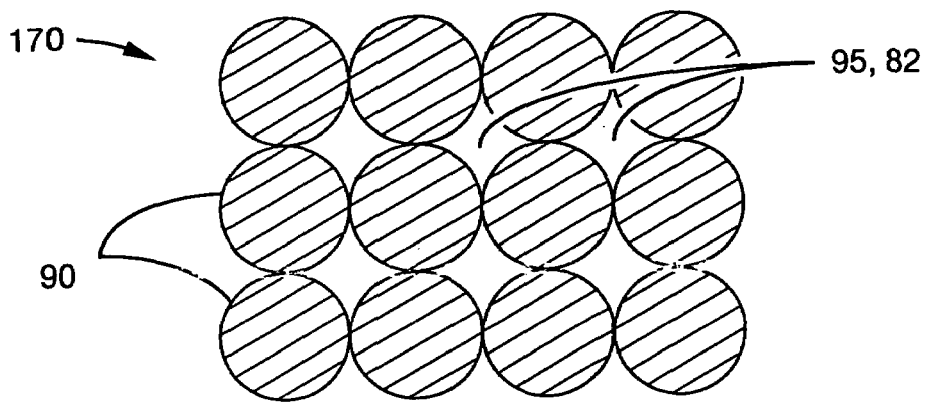
Figure 11C:
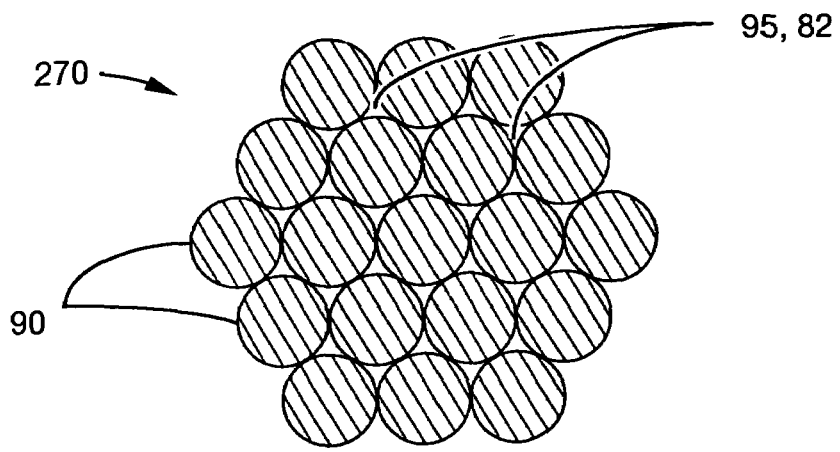

The amount of vapor 335 created by each pulse of the beam 380 can be varied by changing critical parameters such as the liquid 82 used, spot size of the beam 380, the size of the channels 95, the distance between the channels 95 and energy of the beam 380. The size of the channels 95 can be varied by, for instance, changing the relative arrangement of the cylindrical structures 90, as shown in FIG. 11B; by changing the diameter of the cylindrical structures 90, for example a smaller cross-section as shown in FIG. 11C; by changing the cross-sectional shape of the structures 90; or by combining cylindrical structures 90 of different diameters into the same wicking structure 70. Similarly, the timing between the pulse of the beam 380 and the discharge can be varied by changing, for example, the amount of vapor 335 produced by each pulse of the beam 380, and the distance between the second end of the wicking structure 70 and the discharge area. The recovery time of the source (the time before a next XUV radiation pulse can be triggered) can be optimized by changing critical parameters affecting flow rate, such as the size of the channels 95 or the roughness of the cylindrical structures 90.

Damage to the cylindrical structures 90 due to the irradiation of the beam 380, and thus debris in the source, is considerably reduced because in general substantially less energy is required to evaporate a liquid than a solid. Employing such a wicking structure allows the energy of the beam 380 to be reduced and consequently increases the energy conversion efficiency of the source.

Figure 15:
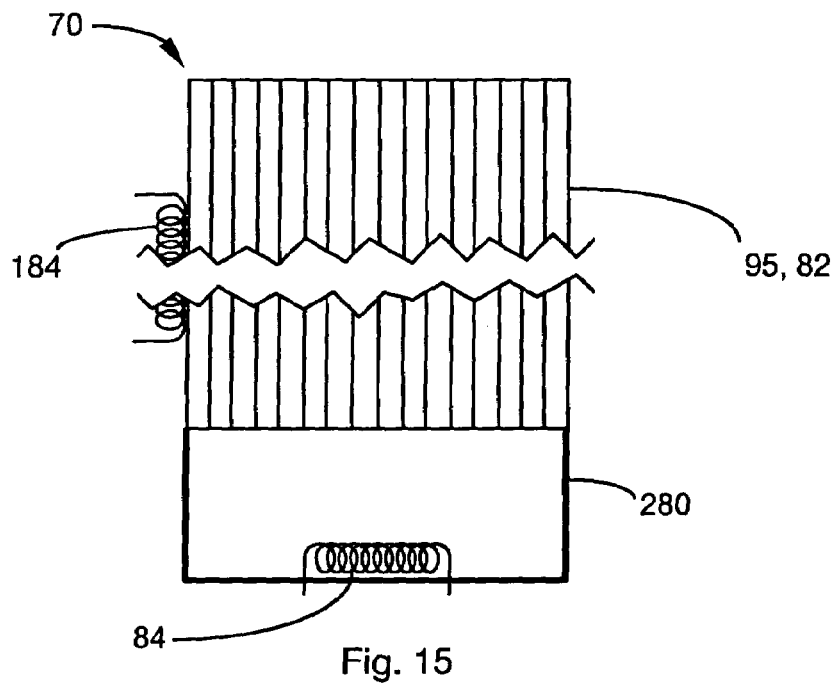
FIG. 15 depicts a target structure for discharge triggering comprising a wicking structure according to an embodiment of the invention.

The flow of liquid 82 through the wicking structure 70 can also be controlled by connecting the first end of the wicking structure 70 to a bath 280 under pressure as illustrated in FIG. 15. The flow of liquid 82 through the channels 95 can thus be varied by changing the pressure of the liquid in the bath 280, either substantially constant or pulsed. The pressure in the bath 280 can be increased by, for example, mechanical means, liquid injection, gas injection or a combination of these.

Figure 13:
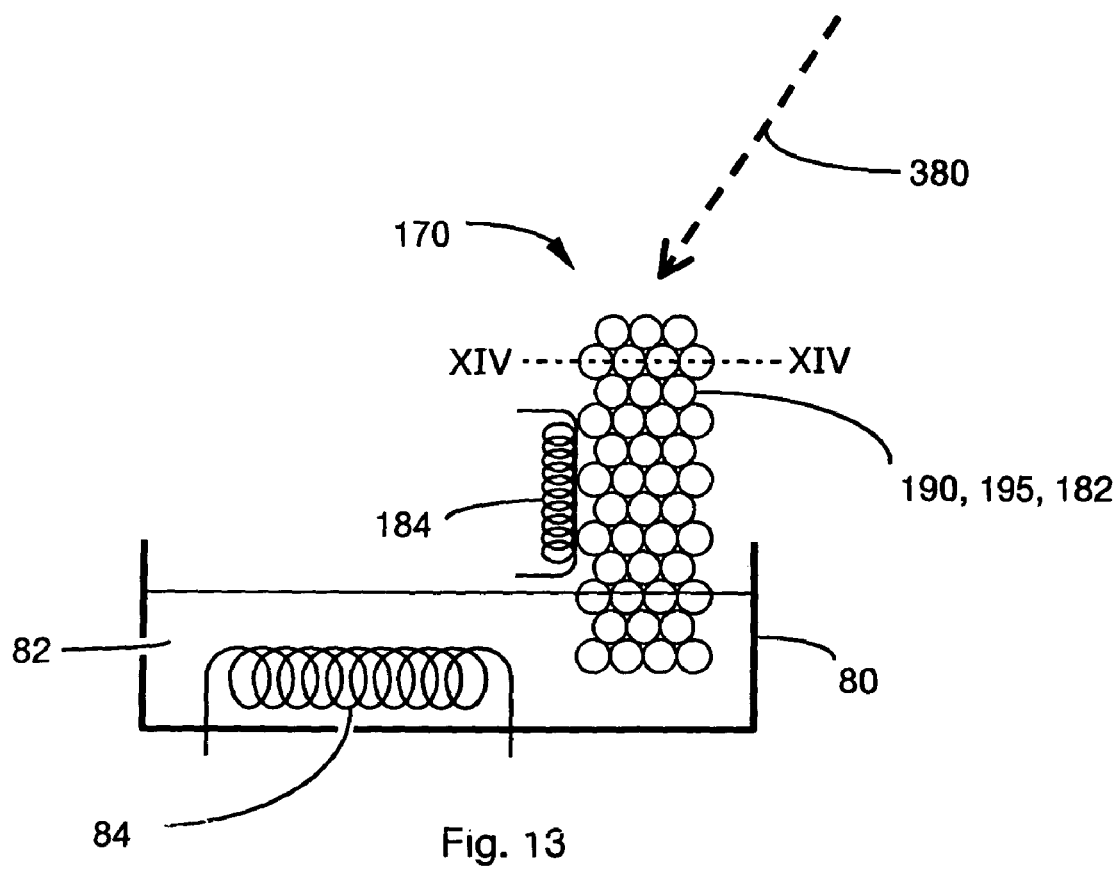
FIG. 13 depicts a target structure for discharge triggering comprising a wicking structure according to an embodiment of the invention.
Figure 14:
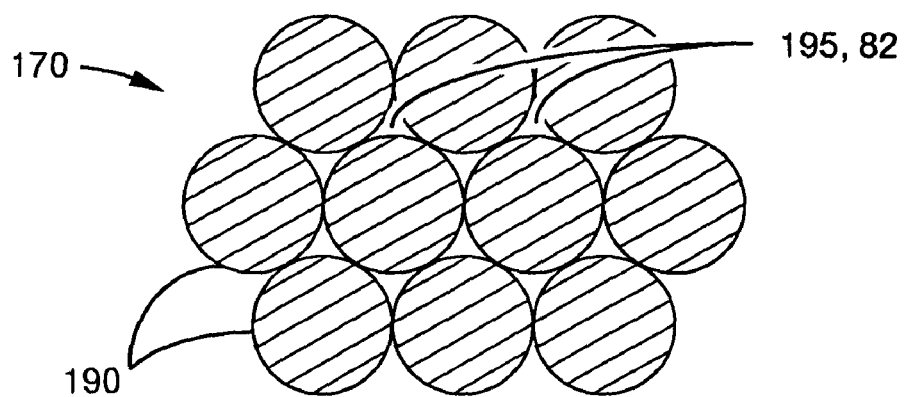
FIG. 14 shows a possible cross-section through a wicking structure according to an embodiment of the invention.

Other shapes may be used to create a regular network of channels for the liquid. An alternative wicking structure 170, similar in construction to the structure 70 illustrated in FIG. 10, is illustrated in FIG. 13. Here the wicking structure 170 comprises closely-packed substantially-identical spheres 190, for example 0.1 mm in diameter. Such a structure can be created by, for example, compressing the spheres together under high pressure at high temperature. A cross-section XIV-XIV through the wicking structure 170 is shown in FIG. 14—the spheres 190 form a channel network 195 similar to that of a sponge that is both symmetric and regular. Operation is similar to the wicking structures already described, where the capillary effect is used to transport the liquid 82 from the first end of the structure 170 to the second end.

Yet another embodiment of a discharge element 240 is schematically depicted in cross-section in FIGS. 8A to 8E. The discharge element 240 comprises an anode 20 and a cathode 10 that are electrically isolated. The assembly is substantially sealed, and supplied with a gas or vapor at low pressure, for instance xenon or lithium, from a discharge material supply (not shown). The anode 20 and cathode 10 are connected to a discharge power supply (not shown), for instance an a.c. voltage supply capable of operating at 100 Hz (not shown). The discharge field lines 45 are also shown.

The discharge element 240 is constructed such that it has a low inductance, for instance less than approximately 20 nH. This may be done as follows:

- a minimal gap between the cathode 10 and the anode 20, for instance several millimeters;
- minimal dimensions of the discharge element 240, for instance a diameter of less than approximately 10 mm at the anode;
- short connections between the discharge power supply (not shown) and the discharge element 240; and
- thick electrical connections, for instance using metal plates instead of wires.

At a predetermined moment in the cycling of the discharge power supply, an electrical trigger is created by allowing the current from the discharge power supply to rise quickly (for instance in less than 100 nanoseconds), and by maintaining the current for a predetermined interval of time, for instance 10 microseconds. The quick rise in current is made possible by the low inductance of the system.

Figure 8A:
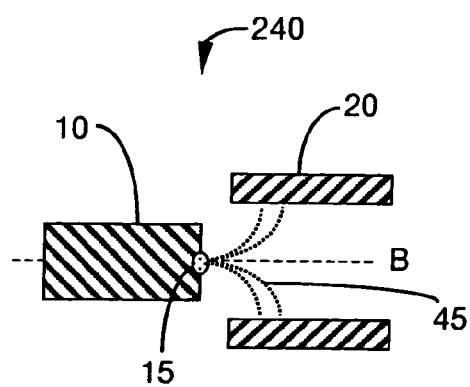
FIGS. 8A to 8D depict a discharge element according to an embodiment of the invention at various stages of yet another type of discharge according to an embodiment of the invention.
Figure 8B:
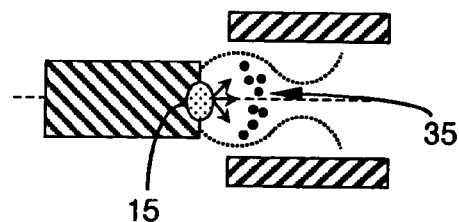
Figure 8C:
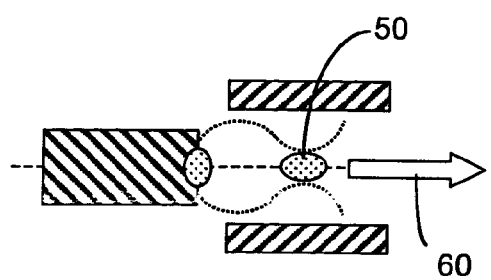
Figure 8D:
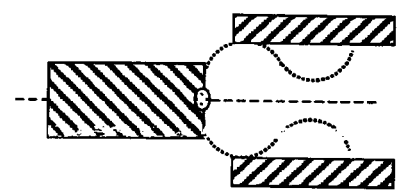

As depicted in FIG. 8A, the discharge element 240 is brought into a state where there is diffuse discharge from a cathode spot 15 to an anode 20. Cathode spots are hot spots that form on the surface on a cathode. They provide the discharge with electrons due to their higher than ambient temperature, and at a high enough temperature, they may supply the discharge with cathode material by evaporation. The current flowing from the cathode 10 to the anode 20 is limited by the discharge power supply (not shown). As shown in FIG. 8B, two physical effects occur as the current flows through the system—supply of cathode material from the cathode spot 15 in the form of low temperature plasma 35 into the discharge gap, and compression of the plasma column due to the pinch effect. As shown in FIG. 8C, the pinch effect results in a constriction (pinch) 50 containing hot plasma. This plasma has a high resistance due to its small cross-section, and effectively transforms the electrical energy of the discharge into thermal energy of the plasma, and finally into emitted radiation 60 along axis B. The high resistance of the constriction 50 causes a current decrease, and the plasma again expands to the walls of the anode as shown in FIG. 8D. The expansion of the plasma results in the formation of diffuse discharge as depicted in FIG. 8A. The resistance of a diffuse discharge is lower, and thus the current rises again. By operating the discharge element 240 such that the cathode spot 15 supplies material continuously, the cycle depicted in FIGS. 8A to 8D repeats continuously. Thus, a self-oscillating (auto-triggering) regime with a plurality of emitted radiation pulses 60 is produced during the predetermined interval of time that the current is maintained by the power supply, for instance, 10 microseconds.

Figure 7:
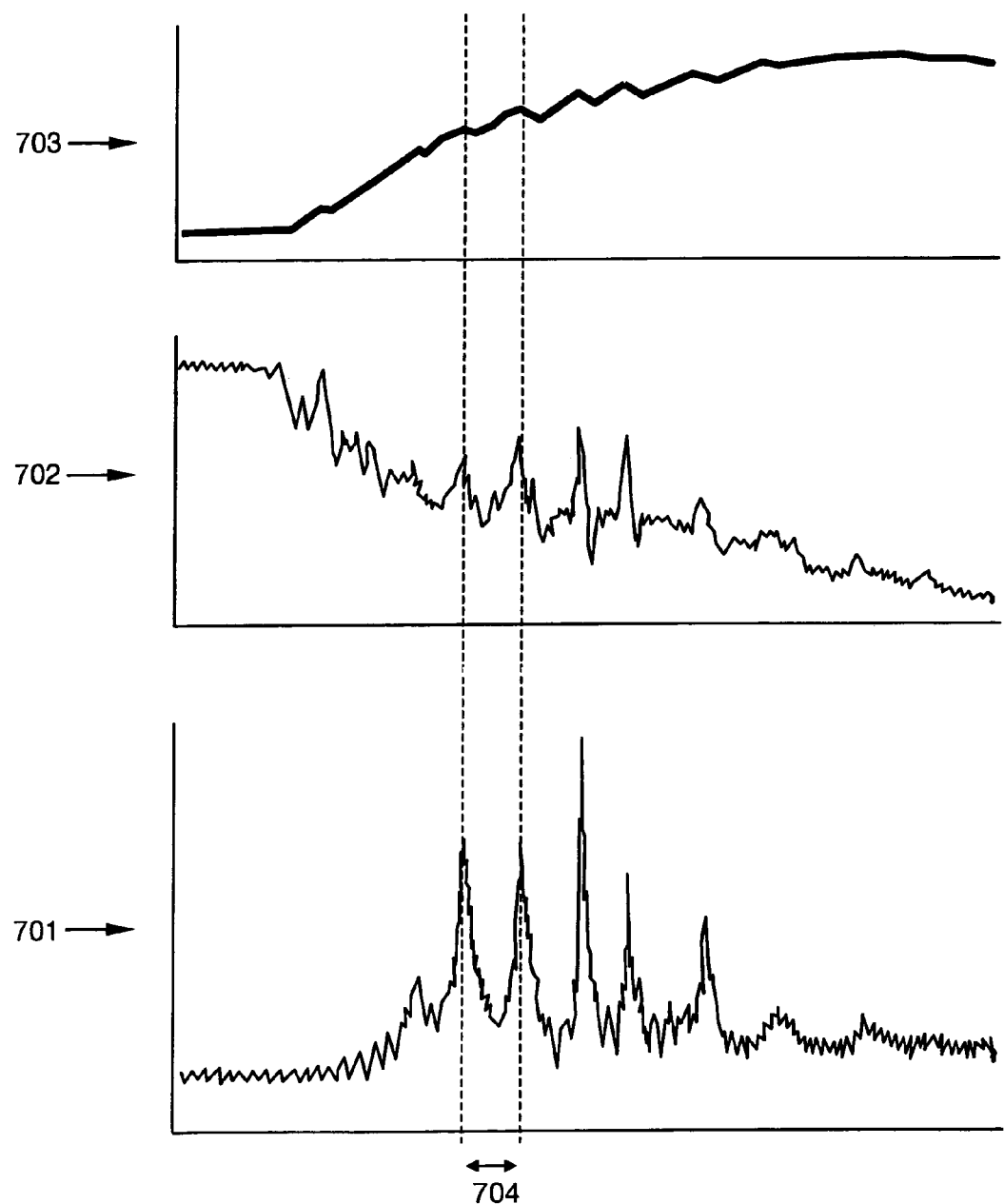
FIG. 7 depicts the measured characteristics of the discharge element employing auto-triggering according to an embodiment of the invention.

FIG. 7 shows measurements on the discharge element 240 during a period of auto-triggering. The graph shows output radiation intensity 701, the current 702 and the voltage 703 of the power supply using lithium vapor as the working substance. The time between pulses 704 is approximately 45 ns (equivalent to 22 MHz).

The reduced size of the plasma region means that only a small part of the energy input into the system is used to heat the plasma in the final stage of the pinch. The rest of the energy is either stored as induction or used for plasma creation. This combination of a low-inductance construction with a continuous supply of discharge material results in the superimposition of multiple plasma pinches onto a permanent discharge. The inductive energy is thus divided over multiple plasma pinches, creating a conversion efficiency of at least 2%.

Alternatively, some of discharge material may be supplied by ablating material from a suitable surface inside the discharge element 240. This can be done using any suitable energetic beam, for instance a laser or an electron-beam.

In another alternative, the formation of the cathode spot 15 at a predetermined position may be encouraged by firing any suitable energetic beam, for instance a laser or an electron-beam at the predetermined position.

This embodiment uses an electrical trigger to precipitate the initial pinch formation, and it uses a cathode spot 15 to provide discharge material 35. It may be advantageous to trigger the initial pinch formation using a laser triggering unit as described in earlier embodiments. In this case, initial pinch formation within the discharge element 240 would occur in a substantially similar way to that shown in FIGS. 6A to 6E, where discharge material 35 is supplied by irradiating a predetermined position on a suitable surface inside the discharge element 240. By repeated irradiation of the suitable surface such that the heated region 337 supplies material continuously, an auto-triggering regime can be maintained. The variations in the position of the irradiated surface described in the earlier embodiments are also applicable to this embodiment.

Accordingly, the scope of the invention should be determined not by the embodiment(s) illustrated, but by the appended claims and their equivalents.

What is claimed is:

1. A radiation source comprising an anode and a cathode that are configured and arranged to create a discharge, within a discharge element, in a substance in a discharge space between said anode and said cathode to form a plasma so as to generate electromagnetic radiation, said radiation source comprising a plurality of discharge elements, wherein said discharge elements are arranged around a rotation axis of said radiation source.

2. A radiation source according to claim 1, wherein each discharge element is movable in line with an optical axis of an apparatus with which said radiation source operates.

3. A radiation source according to claim 1, wherein the anode of a first discharge element is movable in line with the cathode of a second discharge element.

4. A radiation source according to claim 1, wherein at least part of each discharge element is brought in contact with a liquid before initiating a discharge in said element so as to cover internal surfaces of said element with said liquid.

5. A radiation source according to claim 4, wherein said liquid comprises an element selected from the group consisting of: xenon (Xe), tin (Sn), lithium (Li), indium (In) and iridium (Ir).

6. A radiation source comprising an anode and a cathode that are configured and arranged to create a discharge in a substance in a discharge space between said anode and said cathode to form a plasma so as to generate electromagnetic radiation, said radiation source comprising a triggering device configured to initiate said discharge by irradiating a surface proximate said discharge space with an energetic beam.

7. A radiation source according to claim 6, wherein said energetic beam is a beam of electromagnetic radiation.

8. A radiation source according to claim 7, wherein said energetic beam is a laser beam.

9. A radiation source according to claim 6, wherein said energetic beam is a beam of charged particles.

10. A radiation source according to claim 6, wherein said energetic beam irradiates an area on the surface of an anode.

11. A radiation source according to claim 6, wherein said energetic beam irradiates an area on the surface of an anode adjacent to an emission aperture.

12. A radiation source according to claim 6, wherein said energetic beam irradiates an area on the surface of a cathode.

13. A radiation source according to claim 6, wherein said energetic beam irradiates a target structure adjacent to a discharge area.

14. A radiation source according to claim 13, wherein said target structure comprises an element selected from the group consisting of: xenon (Xe), tin (Sn), lithium (Li), indium (In) and iridium (Ir).

15. A radiation source according to claim 13, wherein said target structure forms part of said cathode.

16. A radiation source according to claim 13, wherein said target structure forms part of said anode.

17. A radiation source according to claim 13, wherein the target structure is electrically isolated from said cathode.

18. A radiation source according to claim 13, wherein the target structure is electrically isolated from said anode.

19. A radiation source according to claim 6, wherein the surface irradiated by said energy beam comprises a wicking structure configured to transport a liquid towards said discharge space from a liquid reservoir in contact with said wicking structure.

20. A radiation source according to claim 19, wherein the wicking structure comprises structures leaving spaces therebetween so as to transport said liquid by capillary forces.

21. A radiation source according to claim 20, wherein said wicking structure comprises a regular arrangement of substantially cylindrical structures.

22. A radiation source according to claim 20, wherein said wicking structure comprises a regular arrangement of substantially spherical structures.

23. A radiation source according to claim 19, wherein the radiation source further comprises a pressurizer to exert a pressure upon the liquid within the wicking structure.

24. A radiation source according to claim 23, wherein the pressurizer is configured to exert the pressure in a pulsed fashion.

25. A radiation source according to claim 19, wherein said liquid comprises an element selected from the group consisting of: xenon (Xe), tin (Sn), lithium (Li), indium (In) and iridium (Ir).

26. A method for operating a radiation source, constructed to have a low inductance, and comprising an anode and a cathode that are configured and arranged to create a discharge in a substance in a discharge space between said anode and said cathode to form a plasma so as to generate electromagnetic radiation, said method comprising generating an initial discharge followed by operating said radiation source so as to allow successive discharges to occur due to a substantially self-regulated oscillation within said discharge source.

27. A radiation source according to claim 26, wherein material for discharge is provided by evaporation at the site of a cathode spot.

28. A radiation source according to claim 27, wherein said initial discharge is initiated by increasing the current through said cathode spot.

29. A radiation source according to claim 26, wherein initial discharge is initiated by irradiating a surface proximate said discharge space with an energetic beam.

30. A radiation source according to claim 26, wherein said successive discharges are initiated by irradiating a surface proximate said discharge space with an energetic beam.

31. A lithographic projection apparatus comprising:
a radiation source comprising an anode and a cathode that are configured and arranged to create a discharge, within a discharge element, in a substance in a discharge space between said anode and said cathode to form a plasma so as to generate a projection beam of radiation, said radiation source comprising a plurality of discharge elements, wherein said discharge elements are arranged around a rotation axis of said radiation source;
a support structure configured to hold a patterning device, the patterning device configured to pattern the projection beam according to a desired pattern;
a substrate table configured to hold a substrate; and
a projection system configured to project the patterned beam onto a target portion of the substrate.

32. A lithographic projection apparatus according to claim 31, wherein each discharge element is movable in line with an optical axis of an apparatus with which said radiation source operates.

33. A lithographic projection apparatus according to claim 31, wherein said discharge elements are arranged around a rotation axis of said radiation source.

34. A lithographic projection apparatus according to claim 31, wherein the anode of a first discharge element is movable in line with the cathode of a second discharge element.

35. A lithographic projection apparatus comprising:
a radiation source comprising an anode and a cathode that are configured and arranged to create a discharge in a substance in a discharge space between said anode and said cathode to form a plasma so as to generate a projection beam of radiation, said radiation source comprising a triggering device configured to initiate said discharge by irradiating a surface proximate said discharge space with an energetic beam;
a support structure configured to hold a patterning device, the patterning device configured to pattern the projection beam according to a desired pattern;
a substrate table configured to hold a substrate; and
a projection system configured to project the patterned beam onto a target portion of the substrate.

36. A lithographic projection apparatus according to claim 35, wherein said energetic beam irradiates an area on the surface of an anode.

37. A lithographic projection apparatus according to claim 35, wherein said energetic beam irradiates an area on the surface of an anode adjacent to an emission aperture.

38. A lithographic projection apparatus according to claim 35, wherein said energetic beam irradiates an area on the surface of a cathode.

39. A lithographic projection apparatus according to claim 35, wherein said energetic beam irradiates a target structure adjacent to a discharge area.

40. A lithographic projection apparatus according to claim 35, wherein the surface irradiated by said energy beam comprises a wicking structure configured to transport a liquid towards said discharge space from a liquid reservoir in contact with said wicking structure.

41. A device manufacturing method comprising:
providing a projection beam of radiation using a radiation system comprising a radiation source comprising an anode and a cathode that are configured and arranged to create a discharge, within a discharge element, in a substance in a discharge space between said anode and said cathode to form a plasma so as to generate a projection beam of radiation, said radiation source comprising a plurality of discharge elements, wherein said discharge elements are arranged around a rotation axis of said radiation source;

using a patterning device to endow the projection beam with a pattern in its cross-section;

projecting the patterned beam of radiation onto a target portion of a substrate.

42. A device manufacturing method comprising:

providing a projection beam of radiation using a radiation system comprising a radiation source comprising an anode and a cathode that are configured and arranged to create a discharge in a substance in a discharge space between said anode and said cathode to form a plasma so as to generate a projection beam of radiation, said radiation source comprising a triggering device configured to initiate said discharge by irradiating a surface proximate said discharge space with an energetic beam;

using a patterning device to endow the projection beam with a pattern in its cross-section;

projecting the patterned beam of radiation onto a target portion of a substrate.

* * * * *

UNITED STATES PATENT AND TRADEMARK OFFICE
CERTIFICATE OF CORRECTION

PATENT NO.         : 7,528,395 B2
APPLICATION NO.    : 10/664065
DATED              : May 5, 2009
INVENTOR(S)        : Konstantin Nikolaevitch Koshelev et al.

Page 1 of 1

It is certified that error appears in the above-identified patent and that said Letters Patent is hereby corrected as shown below:

Title Page, Item (56) Cited References: Other Publications

The following references were omitted:

European Search Report dated March 7, 2003; and
English Translation of Japanese Office Action in Japanese Patent Application No. 2003-363845, dated January 31, 2007.

Signed and Sealed this

Twenty-fourth Day of November, 2009

David J. Kappos
*Director of the United States Patent and Trademark Office*